United States Patent [19]

Proskow

[11] 4,431,723

[45] * Feb. 14, 1984

[54] AQUEOUS PROCESSIBLE, ALCOHOL RESISTANT FLEXOGRAPHIC PRINTING PLATES

[75] Inventor: Stephen Proskow, Wilmington, Del.

[73] Assignee: E. I. Du Pont de Nemours and Company, Wilmington, Del.

[*] Notice: The portion of the term of this patent subsequent to Dec. 4, 1996 has been disclaimed.

[21] Appl. No.: 304,371

[22] Filed: Sep. 21, 1981

[51] Int. Cl.$^3$ .............................................. G03C 1/68
[52] U.S. Cl. .................................... 430/286; 430/281; 204/159.14; 204/159.15
[58] Field of Search ........................... 430/286, 281; 204/159.14, 159.15

[56] References Cited

U.S. PATENT DOCUMENTS

| | | | |
|---|---|---|---|
| 2,589,151 | 3/1952 | Serniuk | 260/79.5 |
| 3,825,430 | 7/1974 | Kurka | 96/115 R |
| 4,045,231 | 8/1977 | Toda et al. | 430/286 |
| 4,177,074 | 12/1979 | Proskow | 430/286 |
| 4,248,960 | 2/1981 | Hein et al. | 430/286 |
| 4,272,608 | 6/1981 | Proskow | 430/286 |

FOREIGN PATENT DOCUMENTS

| | | |
|---|---|---|
| 614181 | 2/1961 | Canada . |
| 2720228 | 12/1977 | Fed. Rep. of Germany . |
| 1179252 | 1/1970 | United Kingdom . |

OTHER PUBLICATIONS

Serniuk et al., J. Am. Chem. Soc., 70, pp. 1804 to 1808 (1948).
Marvel et al., Ind. Eng. Chem., 45, pp. 2090 to 2093 (1953).
Merrill et al., Research Disclosure, 143, p.24 (1976).

*Primary Examiner*—Jack Brammer
*Attorney, Agent, or Firm*—James A. Costello

[57] ABSTRACT

Photosensitive elastomeric compositions comprising about 40 to 90 weight percent of a heat workable, carboxyl- and sulfur-containing polymer of a diene; about 2 to 50 weight percent of a nongaseous, ethylenically unsaturated compound; and about 0.001 to 10 weight percent of a radical generating system; the compositions being useful for making flexographic printing plates.

9 Claims, No Drawings

AQUEOUS PROCESSIBLE, ALCOHOL RESISTANT FLEXOGRAPHIC PRINTING PLATES

BACKGROUND OF THE INVENTION

1. Field of the Invention

Aqueous processible, alcohol resistant, photosensitive compositions comprising a specially modified polymer of a diene, an olefin monomer and a radical generating system.

2. State of the Art

Reaction of mercapto acids with unsaturated polymers to give carboxyl-containing polymers is known. Such reactions have been carried out in solution, thermally, or with a free-radical initiator. For instance:

British patent specification No. 1,179,252 discloses the use of butadiene polymers containing carboxyl groups in the preparation of thermoplastic elastomer compositions. The polymers were prepared by reaction of a mercaptocarboxylic acid with polybutadiene in solution in the presence of a free-radical initiator.

U.S. Pat. No. 2,589,151 discloses thioglycolic acid adducts of butadiene copolymers, prepared in solution using a free-radical initiator.

Serniuk et al., J. Am. Chem. Soc., 70, pages 1804 to 1808 (1948) discloses addition of mercaptans to ethylenic bonds.

Marvel et al., Ind. Eng. Chem., 45, pages 2090 to 2093 (1953), disclose the modification of polybutadiene by addition of thiols such as mercaptoacetic acid to give polymers with improved oil resistance. Reaction is carried out in solution using a free-radical initiator.

Merrill et al., Research Disclosure, 143, page 24 (1976), disclose the use of mercapto acid derivatives of unsaturated polymers as a component in liquid electrographic developers. The modified polymers are prepared in solution using a free-radical initiator.

Polymeric binders which contain carboxyl groups have been employed previously in photosensitive compositions. For instance:

German Patent Specification No. 2,720,228 discloses photosensitive compositions consisting of (I) a copolymer of (a) a conjugated diene, (b) an α,β-ethylenically unsaturated carboxylic acid or anhydride, and optionally (c) a monoolefinically-unsaturated compound; (II) a photosensitizer and/or light-sensitive cross-linking agent; and (III) a photopolymerizable unsaturated monomer, useful for flexographic relief printing plates. The carboxyl groups of the copolymer may be neutralized with an alkali metal cation or amine cation.

Canadian Patent No. 614,181 discloses a photopolymerizable composition comprising at least 40 percent by weight of a butadiene homopolymer or copolymer binder including butadiene/acrylonitrile and butadiene/methacrylic acid copolymers, at least 10 percent by weight of an addition-polymerizable ethylenically unsaturated compound, and 0.001 to 10 percent by weight of a polymerization initiator.

U.S. Pat. No. 4,177,074 discloses photosensitive, elastomeric compositions containing (1) a high molecular weight butadiene/acrylonitrile copolymer which preferably contains carboxyl groups, (2) a low molecular weight butadiene polymer, (3) an ethylenically unsaturated monomer, and (4) a free-radical generating system.

U.S. Pat. No. 3,825,430 discloses a light-sensitive composition containing a continuous phase of a light-sensitive organic material and a discontinuous phase of a finely divided, elastomeric organic compound uniformly distributed through the continuous phase, e.g., a carboxyl-containing, high molecular weight butadiene/acrylonitrile copolymer. The discontinuous phase generally represents 5 to 50 percent by weight of the total composition.

SUMMARY OF THE INVENTION

This invention concerns photosensitive compositions characterized by use therein of mercaptocarboxylic acid-modified polymers as binders. More particularly, the compositions of this invention are photosensitive, elastomeric compositions comprising, based on total weight:

(i) about 40 to 90 percent of a heat workable mercaptocarboxylic acid-modified polymer of a diene, said polymer characterized by having (a) a number average molecular weight of about 15,000 to 1,000,000, (b) a carboxyl content of about 1 to 15 percent by weight of polymer (i), (c) at least about 0.7 percent of sulfur, by weight of polymer (i), (ii) about 2 to 50 percent of a nongaseous, ethylenically unsaturated compound containing at least one terminal ethylenic group, said compound being compatible with polymer (i) and polymerizable by the radical generating system of (iii), and (iii) about 0.001 to 10 percent of a radical generating system (initiator) activatable by actinic radiation.

The heat workable mercaptocarboxylic acid-modified polymer of component (i) is referred to herein as the polymer of a diene for the sake of convenience. It is preferred that all or most of the polymer of component (i) is derived from a diene but it is necessary only that there be enough polymer derived from a diene to insure that the polymer is elastomeric and has the recited carboxyl and sulfur contents. Thus, "polymer of a diene" means that the polymer comprises, but is not necessarily limited to, polymer of a diene.

This invention also concerns a photosensitive element comprising a substrate coated with a layer of the photosensitive, elastomeric composition of this invention in a thickness of about 10 to 7600 μm.

This invention also concerns a method for preparing the described photosensitive, elastomeric compositions, comprising:

(A) heat mixing a heat workable polymer of a diene having a number average molecular weight of about 15,000 to 1,000,000 with a mercaptocarboxylic acid for a time sufficient to modify the diene polymer so that it contains:

(a) a number average molecular weight of about 15,000 to 1,000,000, (b) a carboxyl content of about 1 to 15 weight percent, and (c) at least about 0.7 weight percent of sulfur;

(B) mixing the modified polymer made in step (A) with a nongaseous, ethylenically unsaturated compound containing at least one terminal ethylenic group, said compound being compatible with the modified polymer and being polymerizable by a radical generating system, and a radical generating system activatable by actinic radiation, for a time sufficient to obtain a homogeneous composition; and (C) forming said composition into a shape.

The dienes from which polymers of component (i) are made are preferably conjugated or nonconjugated dienes of 4 to 10 carbon atoms, unsubstituted or substituted with $C_1$ to $C_4$ alkyl, Cl, Br or CN. Particularly preferred are polymers of 1,3-dienes and copolymers comprising at least one monomer derived from a 1,3-diene. Most preferred polymers are those derived from 1,3-butadiene and isoprene; including block copolymers of styrene/butadiene and styrene/isoprene.

Contemplated "heat workable" polymers are those which are mechanically workable at temperatures from about room temperature to 200° C. Working (heat mixing) can be effected in various ways including melt extrusion, which is preferred, and milling on a conventional rubber mill. Depending upon the context, the term "polymers" employed herein encompasses copolymers of two or more monomers.

"Substrate" means any natural or synthetic support. Preferred substrates are those capable of existing in a flexible or rigid film or sheet form.

The "number average molecular weight" of heat workable component (i) may be determined by gel permeation chromatography or by other suitable means.

DETAILS OF THE INVENTION

Component (i) Derived From A Diene Polymer

Preferred polymers have number average molecular weights of about 25,000 to 250,000 and a carboxyl content of 1 to 8 percent. Contemplated polymers include homopolymer of a diene, as well as random, graft and block copolymers derived from diene(s). Preferred comonomers include an additional diene or such other comonomers as are commonly used with dienes, e.g., styrene, alkyl- and halo-substituted styrenes, acrylonitrile, acrylic and methacrylic acids, and the like.

Modification of the polymer of component (i) is carried out by reaction of the unmodified polymer with a mercaptocarboxylic acid. It is believed that the thiol group adds to residual unsaturated carbon to carbon groups in the polymer chain yielding the thioether linkage,

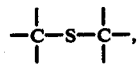

with resultant incorporation of carboxyl groups as substitutents on the polymer chain. The reaction can be carried out in solution with a radical initiator, or thermally.

It is preferred to carry out reaction with the mercaptocarboxylic acid in a melt extruder at a temperature of about 20° C. to 200° C. for a time sufficient to effect essentially complete reaction and provide a modified polymer with the required carboxyl content. Such addition reaction of the mercapto acid to the unsaturated polymer is usually accompanied by peptization of the original polymer, i.e., some decrease in molecular weight and broadening of molecular weight distribution. The peptization process is believed to produce radicals by chain cleavage, such radicals then combining with the mercaptocarboxylic acid to incorporate additional carboxyl groups into the polymer.

Preferred mercaptocarboxylic acids for use in polymer modification are those of the structure:

$$HS-R-CO_2H$$

wherein R is alkylene of 1 to 11 carbon atoms. Suitable mercaptocarboxylic acids include mercaptoacetic acid, 3-mercaptopropionic acid, 2-mercaptopropionic acid, 6-mercaptocaproic acid, 11-mercaptoundecanoic acid, 12-mercaptododecanoic acid, mercaptosuccinic acid, mercaptosuccinic acid mono-n-butyl ester, and 4-mercaptomethylphenylpropionic acid.

The amount of mercaptocarboxylic acid employed to prepare the modified polymer is not critical provided a sufficient amount is used to obtain a modified polymer with the required carboxyl and sulfur contents. Weight ratios of mercaptocarboxylic acid to diene polymer of about 1/20 to 1/1 are usually suitable.

The modified polymer should be present in an amount of about 40 to 90 percent by weight, based on the total composition, and preferably about 60 to 90 percent. At least about 40 percent by weight of the modified polymer is desirable for good flexibility and physical integrity, and to provide enough carboxyl groups for easy processibility in aqueous or semiaqueous basic solution.

The Ethylenically Unsaturated Monomer (ii)

This compound should be capable of forming a polymer by radical initiated chain-propagating addition polymerization and should be compatible with the polymeric binder. One class of suitable ethylenically unsaturated compounds includes unsaturated esters of alcohols, especially esters of alpha-methylene carboxylic acids and substituted alpha-methylene carboxylic acids, more especially such esters of alkylene polyols and polyalkylene polyols, and most especially alkylene polyol di- and tri- acrylates and polyalkylene polyol di- and tri- acrylates prepared from alkylene polyols of 2 to 15 carbon atoms or polyalkylene ether polyols or glycols of 1 to 10 ether linkages.

The following compounds are further illustrative of suitable ethylenically unsaturated compounds: ethylene glycol diacrylate, diethylene glycol diacrylate, glycerol diacrylate, glycerol triacrylate, trimethylolpropane triacrylate, ethylene glycol dimethacrylate, 1,3-propanediol dimethacrylate, 1,2,4-butanetriol trimethacrylate, 1,4-cyclohexanediol diacrylate, 1,4-benzenediol dimethacrylate, 1,2-benzenedimethanol diacrylate, pentaerythritol triacrylate, pentaerythritol tetramethacrylate, 1,3-propanediol diacrylate, 1,3-pentanediol dimethacrylate, p-α,β-dimethylbenzylphenyl acrylate, t-butyl acrylate, N,N-diethylaminoethyl acrylate, N,N-diethylaminoethyl methacrylate, 1,4-butanediol diacrylate, 1,6-hexanediol diacrylate, 1,10-decanediol diacrylate, 2,2-dimethylolpropane diacrylate, tripropylene glycol diacrylate, 2,2-di(p-hydroxyphenyl)propane diacrylate, 2,2-di(p-hydroxyphenyl)propane dimethacrylate, polyoxyethyl-2,2-di(p-hydroxyphenyl)propane dimethacrylate, polyoxypropyltrimethylolpropane triacrylate (molecular weight of 462), 1,4-butanediol dimethacrylate, 1,6-hexanediol dimethacrylate, 2,2,4-trimethyl-1,3-pentanediol dimethacrylate, 1-phenylethylene-1,2-dimethacrylate, trimethylolpropane trimethacrylate, triethylene glycol diacrylate, ethylene glycol acrylate phthalate, polyoxyethyltrimethylolpropane triacrylate, diacrylate and dimethacrylate esters of diepoxy polyethers derived from aromatic polyhydroxy compounds such as bisphenols, novolaks and similar compounds such as those described in U.S Pat. No. 3,661,576, the bis-acrylates and methacrylates of polyethylene glycols of molecular weight 200 to 500, and the like.

Another class of suitable ethylenically unsaturated compounds includes the compounds disclosed in U.S. Pat. No. 2,927,022, e.g., those having a plurality of addition-polymerizable ethylenic linkages, particularly when present as terminal linkages, and especially those wherein at least one and preferably most of such linkages are conjugated with a double bonded carbon, including carbon doubly bonded to carbon and to heteroatoms such as nitrogen, oxygen and sulfur. Preferred are such materials wherein the ethylenically unsaturated groups, especially the vinylidene groups, are conjugated with ester or amide structures. Specific examples of such compounds include unsaturated amides, particularly those of alpha-methylene carboxylic acids, especially with alpha-omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine tris-methacrylamide, bis(γ-methacrylamidopropoxy)ethane, beta-methacrylamidoethyl methacrylate, N-(beta-hydroxyethyl)-beta-(methacrylamido)ethyl acrylate, and N,N-bis(beta-methacryloxyethyl) acrylamide; vinyl esters such as divinyl succinate, divinyl adipate, divinyl phthalate, divinyl terephthalate, divinyl benzene-1,3-disulfonate, and divinyl butane-1,4-disulfonate; diallyl fumarate; and the like.

Additional ethylenically unsaturated compounds which can be used include styrene and derivatives thereof, 1,4-diisopropenylbenzene, 1,3,5-triisopropenylbenzene; itaconic anhydride adducts with hydroxyethyl acrylate (1:1), itaconic anhydride adducts with liquid butadiene/acrylonitrile polymers containing terminal amino groups, and itaconic anhydride adducts with the diacrylate and dimethacrylate esters of diepoxy polyethers described in U.S. Pat. No. 3,661,576; polybutadiene and butadiene/acrylonitrile copolymers containing terminal and pendant vinyl groups; and unsaturated aldehydes, such as sorbaldehyde (2,4-hexadienal).

Ethylenically unsaturated compounds which are water soluble or contain carboxyl or other alkali-reactive groups are especially suitable with the aqueous basic-developable systems which are employed. In addition, the polymerizable, ethylenically unsaturated polymers described in U.S. Pat. No. 3,043,805, U.S. Pat. No. 2,929,710, and similar materials can be used alone or mixed with other materials. Acrylic and methacrylic esters of adducts of ethylene oxide and polyhydroxy compounds such as those described in U.S. Pat. No. 3,380,831 are also useful. The photocross-linkable polymers disclosed in U.S. Pat. No. 3,448,089, can also be used.

The amount of unsaturated compound added should be about 2 to 50 percent by weight, based on total composition. The specific amount for optimum results will vary depending on the nature of the particular modified polymeric binder used. Preferably, the amount of unsaturated compound is about 5 to 35 percent.

Radical Generating System (iii)

Practically any radiation-sensitive, radical generating system which initiates polymerization of the unsaturated compound and does not excessively terminate the polymerization can be used in the photosensitive compositions of this invention. Because process transparencies transmit heat originating from conventional sources of actinic radiation, and since the photosensitive composition is usually prepared under conditions resulting in elevated temperatures, the preferred radical generating compounds are inactive thermally below about 85° C., and more preferably below about 185° C. They should be dispersible in the composition to the extent necessary for initiating the desired polymerization or cross-linking under the influence of the amount of radiation absorbed in relatively short term exposures. These initiators are preferably employed in amounts from about 0.1 to 5 percent based on the total weight of the solvent-free photosensitive composition.

The radical generating system absorbs radiation within the range of about 2000 Å to 5000 Å and has at least one component that has an active radiation absorption band with a molar extinction coefficient of at least about 50 within the range of about 2500 Å to 5000 Å. The term "active radiation absorption band" means a band of radiation which is active to produce the radicals necessary to initiate polymerization or cross-linking of the unsaturated material.

The radical generating system can comprise one or more compounds which directly furnish radicals when activated by radiation. It can also comprise a plurality of compounds, one of which yields the radicals after having been caused to do so by a sensitizer which is activated by the radiation.

A large number of such radical generating compounds can be utilized in the practice of the invention and include aromatic ketones such as benzophenone, Michler's ketone [4,4'-bis(dimethylamino)benzophenone], 4,4'-bis(diethylamino)benzophenone, 4-acryloxy-4'-dimethylaminobenzophenone, 4-acryloxy-4'-diethylaminobenzophenone, 4-methoxy-4'-dimethylaminobenzophenone, 2-ethylanthraquinone, phenanthraquinone, 2-t-butylanthraquinone, 1,2-benzanthraquinone, 2,3-benzanthraquinone, 2,3-dichloronaphthoquinone, benzil dimethyl ketal, desoxybenzoin, and other aromatic ketones; benzoin, benzoin ethers such as benzoin methyl ether, methylbenzoin methyl ether, benzoin ethyl ether, benzoin isobutyl ether, and benzoin phenyl ether, methylbenzoin, ethylbenzoin and other benzoins; and 2,4,5-triarylimidazolyl dimers such as 2-(o-chlorophenyl)-4,5-diphenylimidazolyl dimer, 2-(o-chlorophenyl-4,5-di(m-methoxyphenyl)imidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2,4-di(p-methoxyphenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, and the like as disclosed in U.S. Pat. Nos. 3,479,185 and 3,784,557 and in British Patent Nos. 997,396 and 1,047,569.

The imidazolyl dimers can be used with a radical producing electron donor such as 2-mercaptobenzoxazole, Leuco Crystal Violet or tris(4-diethylamino-2-methylphenyl)methane. Such sensitizers as Michler's ketone can be added. Various energy transfer dyes such as Rose Bengal and Eosin Y can also be used. Preferred as radical generating compounds are the benzoin ethers, particularly benzil dimethyl ketal.

The Photosensitive Compositions and Optional Ingredients

An optional ingredient in the composition of this invention is a low molecular weight butadiene polymer having a number average molecular weight in the range of about 750 to 10,000, and preferably in the range of about 1,000 to 5,000. When the low molecular weight butadiene polymer is added, there results improved mixing and handling and an improvement in the rate of development of the composition. The presence of this optional component also provides a softer and more flexible composition. The low molecular weight polymer can be present in any amount up to about 40 percent by weight based on the total composition, and preferably about 10 percent to 35 percent. If desired, the polymer can comprise acrylonitrile of up to about 50 weight percent and a carboxyl content of up to about 15 weight percent.

The photosensitive composition of this invention can also contain a small amount of thermal, addition polymerization inhibitor, e.g., 0.001 to 5.0 percent, based on the weight of the total solvent-free photosensitive composition. Suitable inhibitors include hydroquinone and alkyl and aryl-substituted hydroquinones, 2,6-di-tert-butyl-4-methylphenol, 4-methyl-2,6-di-tert-butyl-phenol, p-methoxyphenol, tert-butylpyrocatechol, pyrogallol, beta-naphthol, 2,6-di-tert-butyl-p-cresol, phenothiazine, pyridine, nitrobenzene, dinitrobenzene, the nitroso dimer inhibitor systems described in U.S. Pat. No. 4,168,982, and the bis(substituted amino)sulfides disclosed in U.S. Pat. No. 4,168,981. Other useful inhibitors include p-toluquinone, chloranil and thiazine dyes, e.g., Thionine Blue G (CI 52025), Methylene Blue B (CI 52015) and Toluidine Blue (CI 52040). Such compositions can be photopolymerized or photocross-linked without removal of the inhibitor. The preferred inhibitors are 2,6-di-tert-butyl-4-methylphenol, p-methoxyphenol, and 4-methyl-2,6-di-tert-butylphenol.

Because the photosensitive composition contains sulfur which is known as an antiozonant constituent, an added antiozonant may not be required. However, if desired, a conventional antiozonant can be added. Conventional antiozonants include microcrystalline wax and paraffin wax; dibutylthiourea; 1,1,3,3-tetramethyl-2-thiourea; the enol ether derived from cyclohexenylaldehyde and benzyl alcohol; norbornenes, e.g., di-5-norbornene-2-methyl adipate, di-5-norbornene-2-methyl maleate, di-5-norbornene-2-methyl terephthalate; N-phenyl-2-naphthylamine; and unsaturated vegetable oils, such as rapeseed oil, linseed oil and safflower oil. Ozone resistance of the printing relief produced can also be improved by annealing it at elevated temperatures prior to use.

If desired, the photosensitive compositions can also contain immiscible, polymeric or nonpolymeric organic or inorganic fillers or reinforcing agents which are essentially transparent at the wavelengths used for exposure of the photosensitive material and which do not scatter actinic radiation, e.g., polystyrene, the organophilic silicas, bentonites, silica, powdered glass, colloidal carbon, as well as various types of dyes and pigments. Such materials are used in amounts varying with the desired properties of the elastomeric compositions. The fillers are useful to improve the strength of the elastomeric layer, to reduce tack and as coloring agents.

The photosensitive layer can, if desired, include compatible plasticizers to lower the glass transition temperature of the binder and facilitate selective development. The plasticizer can be any of the common plasticizers compatible with the polymeric binder. Suitable plasticizers include dialkyl phthalates, polyethylene glycols and related materials such as substituted phenol/ethylene oxide adducts, e.g., the polyethers obtained from o-, m-, and p-cresol, o-, m-, and p-phenylphenol and p-nonylphenol, including commercially available materials such as the alkyl phenoxypolyoxethylene ethanols. Other plasticizers include the acetates, propionates, butyrates, caprylates and other carboxylate esters of ethylene glycol, diethylene glycol, glycerol, triethylene glycol, pentaerythritol, and other polyhydric alcohols, and alkyl and aryl phosphates such as tributyl phosphate, trihexyl phosphate, trioctyl phosphate, triphenyl phosphate, tricresyl phosphate and cresyl diphenyl phosphate. Other suitable plasticizers include long chain carboxylic acids, e.g., oleic acid, and low molecular weight polyesters, e.g., ethylene glycol sebacates.

The photosensitive compositions of this invention scatter almost no actinic radiation when in the form of thin layers, e.g., less than about 7600 $\mu$m. In order to secure an essentially transparent mixture, i.e., a non-radiation-scattering mixture, the modified polymer, component (i), and any other polymer components should be compatible with, and preferably soluble in, the ethylenically unsaturated compound in the proportions used.

By "compatible" is meant the ability of two or more constituents to remain dispersed in one another without causing any significant amount of scattering of actinic radiation. Compatibility is often limited by the relative proportions of the constituents and incompatibility is evidenced by formation of haze in the photosensitive composition. Some slight haze can be tolerated from such compositions before or during exposure in the preparation of printing reliefs, but when fine detail is desired, haze should be completely avoided. The amount of ethylenically unsaturated compound or any other constituent used is, therefore, limited to those concentrations which do not produce undesired light scatter or haze.

The photosensitive compositions are suitable for other purposes, in addition to printing uses. For instance: for making ornamental plaques or for producing ornamental effects; for making patterns for automatic engraving machines, foundry molds, cutting and stamping dyes; for name stamps; for relief maps; for gaskets; as rapid cure coatings, e.g., on film base, on rollers, inside tanks; in the preparation of printed and microelectronic circuits; for affixing phosphors to surfaces to provide color television screens; and in the preparation of other plastic or elastomeric articles.

Preparation of the Photosensitive Composition

The photosensitive, elastomeric compositions of the invention are prepared by mixing the essential components (i), (ii) and (iii). Flowable compositions are made by mixing the essential components and other desired adjuvants in any order. If desired, mixing can be aided by the presence of a solvent such as a chlorinated hydrocarbon, e.g., chloroform, methylene chloride, chlorobenzene, trichloroethylene and chlorotoluene; ketones such as methyl ethyl ketone, diethyl ketone and methyl isobutyl ketone; aromatic hydrocarbons such as benzene, toluene and xylene; and tetrahydrofuran. The solvents can contain as diluents acetone; lower molecular weight alcohols such as methyl, ethyl and propyl alcohol; and esters such as methyl, ethyl and butyl acetate. The solvent can be removed later by heating the admixture or the extruded layer.

Conventional milling and mixing techniques can be used in making these compositions, the particular technique varying with the differences in properties of the respective components. Milling at elevated temperatures is preferred. The homogeneous, essentially non-radiation-scattering compositions are formed into sheets in any desired manner. For example, solvent-casting, hot pressing, calendering, or extrusion are suitable methods for preparing layers of the desired thickness.

It is preferred to prepare the compositions of this invention in a melt extruder including, as the first step, the modification of diene polymer by heat mixing with a mercaptocarboxylic acid. It may be desired to reduce blending time by premixing the polymer and mercaptocarboxylic acid in a solvent-diluent and letting the mixture stand overnight at room temperature. The solvent is flashed off during initial stages of heating on the extruder. The subsequent step of blending the modified polymer with the ethylenically unsaturated compound, the radical generating system, and any optional ingredients such as antioxidants, plasticizers, thermal inhibitors, etc., is preferably carried out at a temperature of about 50° C. to 150° C. for a time sufficient to obtain a homogeneous composition. The photosensitive composition can be extruded as a sheet and used directly for preparation of a photosensitive element. In preparing a photosensitive element, it is preferred to extrude the photosensitive composition directly onto a substrate.

The Photosensitive Element

The photosensitive, elastomeric compositions of the invention are easily manipulated and can be processed into useful elements without affecting solubility in processing solvents. Furthermore, when elements of this invention are imagewise exposed to actinic radiation, the exposed areas become insoluble and result in tough, shaped elastomeric reliefs with subsequent solvent removal of unexposed portions of the composition. The resulting reliefs exhibit resistance to a variety of inks including water, alcohol, and ester-containing inks. They also show an improvement in resistance to hydrocarbon inks compared with noncarboxylated compositions.

In addition, the compositions of the invention before polymerization retain their solubility in aqueous or semiaqueous basic solutions. Photosensitive elements prepared from such compositions can be exposed and developed by washing with aqueous or semiaqueous basic solutions to produce a photoimage. Use of such aqueous basic developing solutions avoids the use of organic solvents which are costly and present fire, health and ecological hazards.

The combination of properties exhibited by the novel elements, particularly aqueous or semiaqueous basic solution processibility and tolerance of the reliefs to alcohol-based inks, make the elements particularly useful as improved flexographic printing plates.

The photosensitive elements of this invention are prepared by application of the photosensitive composition to a substrate. Suitable substrates include metals such as steel and aluminum plates, sheets and foils; cellulose paper, fiberboard, and films or plates composed of various film-forming synthetic resins or high polymers, such as the addition polymers and in particular vinylidene chloride copolymers with vinyl chloride, vinyl acetate, styrene, isobutylene and acrylonitrile; vinyl chloride homopolymers and copolymers with vinyl acetate, styrene, isobutylene and acrylonitrile; linear condensation polymers such as polyesters, e.g., polyethylene terephthalate; polyamides, e.g., polyhexamethylenesebacamide; polyimides; and polyester amides, e.g., polyhexamethyleneadipamide adipate and the like, or a composite of two or more of these materials. Fillers or reinforcing agents can be present in the synthetic resin or polymer bases such as the various fibers (synthetic, modified, or natural), e.g., cellulosic fibers, for instance, cotton, cellulose acetate, viscose rayon; paper; glass wool; nylon and polyethylene terephthalate. These reinforced bases can be used in laminated form.

Other substrates include copper, alumina-blasted aluminum, oriented polyester film, alumina-blasted oriented polyester film, polyvinylidene chloride-coated oriented polyester film, polyvinyl alcohol-coated paper, cross-linked polyester-coated paper, nylon, glass, heavy paper such as lithographic paper, polypropylene film, silicon wafers, and the like. Various anchor layers can be used to give strong adherence between the substrate and the photosensitive layer. In the case of a transparent substrate, preexposure through the substrate to actinic radiation may be useful.

The photosensitive elements can be made by solvent casting or by extruding, calendering or pressing, at an elevated temperature, the photosensitive composition into the form of a layer or self-supporting sheet on a suitable casting wheel, belt or platen. The layer or sheet can be laminated to the surface of a suitable permanent substrate or, if necessary, it can be affixed by means of a suitable adhesive, or the solution can be coated directly onto a suitable substrate. The photosensitive elements can have antihalation material beneath the photosensitive layer. For instance, the substrate can contain an antihalation material or have a layer or stratum of such material on its surface. Antihalation layers comprising pigments such as carbon black, manganese dioxide, and various dyes, are particularly useful when highly reflective substrates are used. The elements can be made in the various manners described in U.S. Pat. Nos. 2,760,863, 2,791,504 and 3,024,180. The photosensitive layer itself can serve as the light absorption layer when dyes or pigments are included in the photosensitive composition or when the layer is sufficiently thick.

The thickness of the photosensitive layer is a direct function of the thickness desired in the relief image and will depend on the subject being reproduced and the ultimate use of the relief, e.g., thick soft reliefs are useful for flexographic printing and thin hard reliefs are useful for planographic printing.

The oxygen resistance of photosensitive elements of this invention and printing reliefs made therefrom can be improved by incorporating into the photosensitive composition a suitable amount of compatible well-known antioxidant. Antioxidants useful in this invention include: alkylated phenols, e.g., 4-methyl-2,6-di-tert-butylphenol, alkylated bis-phenols, e.g., 2,2-methylene-bis-(4-methyl-6-tert-butylphenol); 1,3,5-trimethyl-2,4,6-tris-(3,5-di-tert-butyl-4-hydroxybenzyl)benzene; 2-(4-hydroxy-3,5-di-tert-butylanilino)-4,6-bis-(n-octylthio)-1,3,5-triazine; polymerized trimethyldihydroquinone; and dilauryl thiodipropionate.

The photosensitive compositions of this invention are, in general, solids. They are also, frequently, depending on their composition, somewhat tacky on the surface. This latter property is of advantage in that compositions adhere of themselves to the substrate being used and do not usually require the application of an adhesive to retain them on the substrate, both during photoexposure and development steps and during subsequent use of the insolubilized material as a printing plate.

The elements of the invention can be provided with a transparent flexible cover sheet such as a thin film of polystyrene, polyethylene, polypropylene, polyethylene terephthalate or other strippable material on the side of the photosensitive layer remote from the substrate to prevent contamination of, or damage to, the photosensitive layer during storage or manipulation.

The elements can also be provided with a thin, hard, flexible, solvent-soluble layer, such as a flexible, polymeric film or layer, e.g., of a polyamide or a copolymer of ethylene and vinyl acetate, or the known type of mold-release agents, e.g., certain commercially available silicones. Preferred are polymers which are soluble in the aqueous solutions normally used for development, e.g., poly(vinyl alcohol). This layer is interposed between the cover sheet, when present, and the upper surface of the photosensitive layer when it is desired to protect for reuse an image-bearing negative or transparency superposed thereon or to improve contact or alignment with the photosensitive surface. If desired, the photosensitive element can also have on the reverse surface of the substrate a pressure-sensitive adhesive layer provided with a protective strippable layer. Upon removal of the latter, the element can be processed onto or otherwise adhered to a permanent substrate such as a printing block or metal plate.

Printing and Development

Printing reliefs can be made in accordance with this invention by exposing to actinic radiation selected portions of a photosensitive layer of an element described above, for example, through a process transparency such as an image-bearing transparency or stencil having areas essentially transparent to actinic radiation and of substantially uniform optical density and areas opaque to actinic radiation and of substantially uniform optical density until substantial addition-polymerization or photocross-linking takes place. During the addition-polymerization or cross-linking, the polymeric binder/ethylenically unsaturated compound composition is converted to the insoluble state in the radiation-exposed portions of the layer, with no significant polymerization or cross-linking taking place in the unexposed portions or areas of the layer. The unexposed portions of the layer are removed by action of the developing agent on the polymeric binder. The process transparency can be made from any suitable material including cellulose acetate film and oriented polyester film.

Actinic radiation from any source and of any type can be used in the photopolymerization process. The radiation can emanate from point sources or be in the form of parallel rays or divergent beams. By using a broad radiation source relatively close to the image-bearing transparency, the radiation passing through the clear areas of the transparency enters as divergent beams and thus irradiates a continually diverging area in the photopolymerizable layer underneath the clear portions of the transparency. This results in a polymeric relief having its greatest width at the bottom of the photopolymerizable layer, i.e., a frustum, the top surface of the relief being the dimensions of the clear area.

Inasmuch as the radical generating systems activatable by actinic radiation generally exhibit their maximum sensitivity in the ultraviolet range, the radiation source should furnish an effective amount of this radiation. Suitable sources of such radiation, in addition to sunlight, include carbon arcs, mercury-vapor arcs, fluorescent lamps with ultraviolet radiation-emitting phosphors, argon glow lamps, lasers, electronic flash units and photographic flood lamps. Electron accelerators and electron beam sources through an appropriate mask may also be used. Of these, the mercury-vapor lamps, particularly the sunlamp or "black light" type, and the fluorescent sunlamps, are most suitable.

The radiation exposure time can vary from fractions of a second to minutes, depending upon the intensity and spectral energy distribution of the radiation, its distance from the composition and the nature and amount of the composition available. Customarily, a mercury-vapor arc or a sunlamp is used at a distance of about 1.5 to 60 inches (3.8 to 153 cm) from the photosensitive composition. Exposure temperatures are not particularly critical, but it is preferred to operate at about 20° to about 35° C.

After exposure, the image can be developed by washing with a suitable solvent. The solvent liquid should have good solvent or swelling action on the polymeric binder/ethylenically unsaturated compound composition and little action on the insolubilized image or upon the substrate material, antihalation layer, or anchor layer, in the period required to remove the nonpolymerized or noncross-linked portions.

Although organic solvents and solvent mixtures can be employed for development, it is preferred to employ as development solvents an aqueous base to which a water-soluble organic solvent can be added. Suitable specific solvent mixtures include sodium hydroxide/isopropyl alcohol/water, sodium carbonate/water, sodium carbonate/2-butoxyethanol /water, sodium borate/2-butoxyethanol/water, sodium silicate/2-butoxyethanol/glycerol/water, sodium carbonate/2-(2-butoxyethoxy)ethanol/water, ammonium carbonate/2-(2-butoxyethoxy)ethanol/water, 2-amino-2-methyl-1-propanol/2-(2-butoxyethoxy)ethanol/ water, 2-dimethylamino-2-methyl-1-propanol/2-(2-butoxyethoxy)ethanol/water, 2-amino-2-ethyl-1,3-propanediol/2-(2-butoxyethoxy)ethanol/water, diethanolamine/2-(2-butoxyethoxy)ethanol/water, sodium hydroxide/2-(2-butoxyethoxy)ethanol/water, and ammonia/2-(2-butoxyethoxy)ethanol/water. The particular solvent combination chosen will depend upon the carboxyl-content of the photosensitive composition and the properties and amounts of the binder employed. Other aqueous solvent combinations which can be employed are described in U.S. Pat. No. 3,796,602. These aqueous base/water-soluble organic solvent combinations are preferred because of their low cost, nonflammability and reduced toxicity.

Solvent development can be carried out at about 25° C., but best results are obtained at about 30° to 60° C. Development time varies usually between about 5 to 40 minutes.

In the development step where the relief is formed, the solvent may be applied in any convenient manner, as by pouring, immersion, spraying, or roller application. Brushing is preferred.

Alternatively, depending upon application, development of the image after exposure can be carried out by toning, i.e., dusting with a fine pigment which selectively adheres to the tacky unpolymerized areas, use of peel apart transfer, pressure transfer, and differential adhesion of the exposed versus unexposed areas.

The printing reliefs made in accordance with this invention can be used in all classes of printing, but are most applicable to those classes of printing wherein a distinct difference of height between printing and nonprinting areas is required, and particularly to the flexographic printing class wherein a resilient print area is required, e.g., for printing on deformable printing surfaces. These classes include those wherein the ink is carried by the raised portion of the relief such as in dry-offset printing, ordinary letter-press printing, the latter requiring greater height differences between printing and nonprinting areas, and those wherein the ink is carried by the recessed portions of the relief such as in gravure and intaglio printing, e.g., line and inverted half-tone. The plates are also useful for multicolor printing.

The photosensitive compositions of this invention are also useful in the preparation of photo-resists for etching, gravure, planograph plates, semiconductor wafers, and screens for "silk screen" printing or as stencils. The compositions can be coated onto printing cylinders, e.g., plastic or metal cylinders, or attached thereon as photosensitive elastomeric layers.

The photosensitive, elastomeric compositions of this invention are characterized by good hardness, impact resilience, clarity, resistance to water-, alcohol-, and ester-based inks, and ease of preparation of printing elements therefrom. Additional advantages include processibility in aqueous or semiaqueous basic solution with little swelling, and low cost, nonflammability, ozone resistance, and reduced toxicity derived from use of aqueous developer solutions.

The following Examples illustrate the inventions, preferred embodiments being described in Examples 3, 5, 8, 10 and 14. All parts and percentages are by weight and all degrees are Celsius unless otherwise noted.

The photosensitive compositions were generally prepared by mixing the ingredients under yellow light on a rubber mill at the specified temperature. The order of mixing was usually as follows:

(1) polymeric binder;

(2) any optional component if employed, e.g., plasticizer, low molecular weight butadiene polymer, thermal inhibitor;

(3) ethylenically unsaturated compound and radical generating system, usually premixed in advance. In an alternative method, the ingredients were premixed with methylene chloride and sealed in a jar overnight to form a solid, gel-like plug which was then added to the mill. This facilitated mixing of the ingredients and substantially shortened the time required for milling. The methylene chloride was removed by evaporation during the milling process.

Preparation of Printing Plates

Experimental flexographic printing plates were prepared by melt-pressing the milled photosensitive compositions in a Pasadena press between a 5-mil (127-μm) flame-treated oriented polyester film substrate and a polytetrafluoroethylene cover sheet using 65-mil (1650-μm) or 112-mil (2840-μm) metal shims to control plate thickness. Unless otherwise noted, the plates were pressed at 100° to 120° and 15,000 to 20,000 psi (103,000 to 138,000 kPa). The polytetrafluoroethylene cover sheet was replaced with a 1-mil (25.4-μm) cover sheet of clear polypropylene film to provide a slip layer and to allow exposure of the plate through the cover sheet.

The 65-mil (1650-μm) thick plate samples were exposed for 15 min in a vacuum frame at about 250 mm mercury pressure to radiation from a bank of four closely spaced ultraviolet lamps (Sylvania blacklight very high output lamps, FR-48T12-B1-VHO-180, 48 W) held 6 inches (15.2 cm) from the sample. A sheet of standard antihalation material was placed on the underside of the samples during exposure. Standard negative resolution targets were used as process transparencies in contact with the photosensitive compositions. After exposure, the polypropylene cover sheet was removed and the images were developed mechanically by brushing the plate surfaces for 20 or 30 min at about 55° to 60° in the specified aqueous base developer solution. The development was conducted with a single-brush prototype of a commercial processor (Cyrel® Plate Processor; Model No. 2-1824; Du Pont Co.) which was modified with a heater to allow operation at elevated temperatures. After development, the plates were air-dried for 15 to 30 min at about 50° to 60°, further dried at 25° overnight, and finally postexposed for 5 min in air with the lamp source described. Plate clarity, flexibility, relief height, and image quality were assessed for these plates.

The 112-mil (2840-μm) thick plate samples were exposed to the described radiation using the following procedure: (1) the back of the plate was first exposed through the substrate for 1.5 min in air (back-exposure); (2) the top of the plate was exposed for 15 min under vacuum (blanket exposure); (3) the top of the plate was postexposed in air for 10 to 15 min, after development and drying in the usual way. The development (for 10 min) and drying steps were conducted in this case to expose the plates to these processing steps prior to testing. The plates were examined for ink solvent resistance, hardness and resilience as described below.

The ink solvent resistance was determined by immersing 1 in.×2 in. (2.5×5.1 cm) samples of the finished plates in various test solvents or solvent mixtures (in which proportions are by volume), and the percent volume swell after 24 hr was measured. Volume swell was calculated from the weight of sample in air (A) and weight in a buoyant liquid (L), usually 2-propanol, by the equation:

Percent Volume Swell
$= [(W_{2A} - W_{2L})/(W_{1A} - W_{1L}) - 1]100$ where $W_1$ and $W_2$ represent the sample weights before and after immersion, respectively. The percent weight depletion caused by solvent extraction was subsequently determined by reweighing the test samples after drying them in air at room temperature for at least seven days.

Hardness was measured using a Shore A Durometer with the plate sample placed on a hard surface. Resilience was subjectively determined by pressing the sample with a thin object (e.g., spatula, thumbnail), then releasing and rubbing the thin object over the depression until fully recovered. A 10 sec recovery was called poor. Impact resilience was measured as described in ASTM D2632 using the Shore Resiliometer, Model SR-1.

EXAMPLE 1

A solution of 100 g of a 16/84 styrene/isoprene linear ABA block copolymer (Kraton® 1107; Shell Chemical Co., $M_n$ about 100,000), 15 g of 3-mercaptopropionic acid and 0.6 g of α,α'-azobis-(isobutyronitrile) initiator in 600 ml of toluene was charged into a 1-liter Hastelloy-lined, stainless steel tube. The tube was purged with nitrogen and heated with agitation for 6 hours at 75°. The tube was cooled, vented, and the jelly-like mass was allowed to evaporate in an open dish. The remaining solvent was removed by further drying the mass to constant weight under vacuum at 50°. The solid material was combined with the product from a second identical run.

The mixture of products was blended on a cold mill at about 25°. The blend was divided into two equal portions, and one portion was further blended on a mill at 110° (the "hot-blend polymer" sample). The cold- and hot-blend polymers were then used to prepare photosensitive compositions according to the general procedure described.

The following ingredients were blended by milling at 110°:
75 parts of "cold-blend polymer"
12 parts of oleic acid
12 parts of 1,6-hexanediol diacrylate
1 part of benzil dimethyl ketal.

The polymer did not band readily on the mill until the other ingredients were added, and then it formed a fluid, sticky layer that partitioned between the rolls. The rolls were cooled and the soft and sticky photosensitive composition was removed.

Plates were pressed from the blend at 130° and 20,000 psi (138,000 kPa) by the general procedure described. The 65-mil (1650-μm) plate was exposed to radiation for 15 min through a line process negative, and the exposed image was developed for 20 min in a solution of 0.8% sodium carbonate in 2-(2-butoxyethoxy)ethanol/water (1/9). After development, the plate was dried and postexposed for 15 min as described. A relief image (12.5 mil, 320-μm) was obtained corresponding to the transparent areas of the process transparency. The clear, faintly tacky plate was characterized by good flexibility and excellent image sharpness in the raised relief areas. The plate was completely detackified by briefly immersing it in a solution, by volume, of 90 parts water, 9 parts of 5% aqueous sodium hypochlorite, and 1 part of concentrated hydrochloric acid.

The 112-mil (2840-μm) plate was exposed, developed and postexposed by the general procedure described. The plate exhibited good-excellent resilience, impact resilience of 24%, and a Shore A Durometer hardness of 33. It had satisfactory solvent resistance for use with alcohol-based inks as indicated by the 24-hr solvent immersion test data summarized in the Table.

The "hot-blend polymer" sample was used to prepare a photosensitive composition in the same manner. Exposed plates of this composition exhibited similar properties as those described for plates from the cold-blend polymer. However, the 1650-μm plate gave an image with essentially no relief.

EXAMPLE 2

A. Preparation of Binder

Kraton ® 1107 (100 g) was mixed with a solution of 3-mercaptopropionic acid (20 g) in 60 ml of methylene chloride and the mixture was kept in a tightly sealed jar overnight. The resultant plug of the ingredients was transferred to a rubber mill and milled for 30 min at about 20° to 60°. The methylene chloride was evaporated during the initial stages of milling and a clear, tacky sheet of the binder remained at 60°.

The crude product was dissolved in a solution of 600 ml of methylene chloride, 30 ml of methanol, and 1.0 g of 1,3,5-trimethyl-2,4,6-tris-(3,5-di-t-butyl-4-hydroxybenzyl)benzene antioxidant. This solution was added slowly to a 4-fold excess of methanol in a high-speed blender to precipitate the polymer. The polymer was separated, washed three times with fresh methanol in the blender and dried to constant weight, first in air and then in vacuum at 40° to 50°. The carboxylated binder was obtained as a colorless tacky solid, weight 91 g. An infrared spectrum of a thin film of the polymer showed strong C=O absorption at 1700–1750 cm$^{-1}$. Analysis: 1.32% S corresponds to 1.86% carboxyl groups. Neutralization Equivalent: 2.234, corresponding to 2.01% carboxyl groups.

B. Photosensitive Composition: Preparation and Imaging

The following ingredients were premixed and blended on a rubber mill by the general procedure described.
75 parts of the binder of Part A
12 parts of oleic acid
12 parts of 1,6-hexanediol diacrylate
0.1 part of 4-methyl-2,6-di-t-butylphenol
1.0 part of benzil dimethyl ketal
67 parts of methylene chloride.

This premixed plug was added to the rolls at room temperature, the rolls were heated to 100° to 110°, and then re-cooled before removing the blend. The photosensitive composition was clear and tacky.

Plates were pressed from the composition, and the plates were exposed and then developed for 20 min in a solution of 0.8% sodium carbonate in 2-(2-butoxyethoxy)ethanol/water (1/9) by the general procedure described. The plates were postexposed and evaluated. Solvent resistance data are summarized in the Table. Shore A hardness, 34; relief, 34 mils (864-μm); resilience, excellent; impact resilience, 31. The imaging characteristics were similar to those of the plates described in Example 1.

EXAMPLE 3 AND COMPARISON A

A. Preparation of Binder

A plug containing 100 g of Kraton ® 1107, 15 g of 3-mercaptopropionic acid and 50 ml of methylene chloride was prepared and milled at 50° for 20 min. The plug formed a clear, tacky sheet which was readily stripped from the rolls. The product was dissolved in a solution of 500 ml of methylene chloride, 25 ml of methanol, and 2.0 g of 1,3,5-trimethyl-2,4,6-tris(3,5-di-t-butyl-4-hydroxybenzyl)benzene antioxidant. This solution was combined with two other solutions prepared by identical runs. The polymer was precipitated from the combined solution in an excess of methanol in a high-speed blender, washed and dried as described in Example 2. A total of 282 g of slightly tacky binder was obtained. An infrared spectrum (film) showed carbonyl absorption at 1700–1750 cm$^{-1}$. Analysis: 0.97% S corresponds to 1.36% carboxyl groups.

B. Photosensitive Composition: Preparation and Imaging

The following ingredients were premixed and blended on a rubber mill at 100° for 5 min by the general procedure described.

Formulation A 75 parts of the binder of Part A
12 parts of oleic acid 12 parts of 1,6-hexanediol diacrylate
0.5 part of 4-methyl-2,6-di-t-butylphenol
0.1 part of 1,4,4-trimethyl-2,3-diazabicyclo[3.2.2]non-2-ene-N,N'-dioxide
1 part of benzil dimethyl ketal
33 parts of methylene chloride.

COMPARISON A

Ingredients and proportions were identical to those in Formulation A except that the binder of Part A was replaced with 75 parts of unmodified Kraton ® 1107.

The clear, tacky photosensitive compositions were removed after the rolls were cooled to room temperature. Plates were pressed from the compositions, and the plates were exposed and then developed by the general procedure described. The development solutions consisted of:

(1) 1.7% concentrated ammonia in 2-(2-butoxyethoxy)ethanol/water (1/9), (2) 0.8% sodium carbonate in 2-(2-butoxyethoxy)ethanol/water (1/9).

The 1650-μm plates were developed for 30 min in Solutions 1 and 2 and the 2840-μm plates were developed for 10 min in Solution 1. The 1650-μm plates of Formulation A readily formed sharp relief images upon development in contrast to the control plates of Comparison A which could not be developed significantly, as illustrated by the following data.
Development Solution 1:Plate A, 36 mil (914 μm) relief.
  Comparison Plate A, about 2 mil (50 μm) relief.
Development Solution 2:Plate A, 20 mil (508 μm) relief.
  Comparison Plate A, about 2 mil (50 μm) relief.
Hence, the Comparison Plate gave essentially no relief image because of lack of significant development.

The 2840-μm plates exhibited the following physical properties after postexposure. Solvent resistance data are summarized in the Table. Plate A: Shore A hardness, 57–59; resilience, good; impact resilience, 34–36. Comparison Plate A: Shore A hardness, 56; resilience, good; impact resilience, 59.

EXAMPLE 4 AND COMPARISON B

The following ingredients were premixed and blended on a rubber mill at 100° for 5 min by the general procedure described.

Formulation A 70 parts of the binder of Example 3, Part A
17 parts of Hycar ® CTB (2000×162)
0.5 part 4-methyl-2,6-di-t-butylphenol
0.1 part of 1,4,4-trimethyl-2,3-diazabicyclo-[3.2.2.]non-2-ene-N,N'-dioxide
1 part of benzil dimethyl ketal
33 parts of methylene chloride.

Hycar ® CTB (2000×162) (B. F. Goodrich Co.) is a carboxyl-terminated polybutadiene liquid rubber, Brookfield viscosity =60,000 cP at 27°.

Comparison B

Ingredients and proportions were identical to those in Formulation A except that the binder of Part A was replaced with 70 parts of unmodified Kraton ® 1107.

The clear, tacky photosensitive compositions were removed after the rolls were cooled to room temperature. Plates were pressed from the compositions, and the plates were exposed and then developed by the general procedure described. The development solutions used were Solutions 1 and 2 of Example 3. The 1650-μm plate of Formulation A readily formed sharp relief images with development in Solution 1 compared with the control plates of the Comparison Plate which could not be developed significantly.
Plate A: 40 mil (1015 μm) relief.
Comparison Plate: 2 mil (50 μm) relief.

With developer Solution 2, the plate of Formulation A swelled about 10 mils (250 μm) in the unexposed areas, whereas unexposed areas of the Comparison Plate were virtually unaffected by Solution 2.

The 2840-μm plates exhibited the following physical properties after postexposure. Solvent resistance data are summarized in the Table.
Plate A: Shore A hardness, 57–58; resilience, good; impact resilience, 23–26. Comparison Plate B: Shore A hardness, 46–47, resilience, good; impact resilience, 25–26.

EXAMPLE 5

A. Preparation of Binder

Using the general procedure of Example 3, reaction of 200 g of Kraton ® 1107 and 30 g of 3-mercaptopropionic acid was effected by milling at 60° for 25 min. The crude product was dissolved in a solution of 500 ml of methylene chloride, 25 ml of methanol, and 2.0 g of 1,3,5-trimethyl-2,4,6-tris-(3,5-di-t-butyl-4-hydroxybenzyl)benzene antioxidant. This solution was combined with three other solutions obtained from similar runs. The polymer was precipitated from solution in an 8-fold excess of methanol in a high-speed blender, washed, and dried as described in Example 2. The dried, slightly tacky binder (756 g) was characterized by infrared spectrum (film) and by sulfur analysis; med C=O absorption at 1700–1750 cm$^{-1}$; 0.86% S corresponds to 1.21% carboxyl groups.

B. Photosensitive Composition: Preparation and Imaging

The following ingredients were premixed and blended on a rubber mill at 75° to 80° for 10 min by the general procedure described.
140 parts of the binder of Part A
20 parts of Hycar ® CTB (2000×162)
18 parts of oleic acid
20 parts of 1,6-hexanediol diacrylate
1 part of 4-methyl-2,6-di-t-butylphenol
2 parts of benzil dimethyl ketal
67 parts of methylene chloride.

The clear, tacky composition was removed from the mill after the rolls were cooled to room temperature.

Plates were pressed from the composition, and the plates were exposed and then developed by the general procedure described. The 1650-μm plates were developed for 30 min at 55° to 60° employing the development solutions listed below. Sharp relief images were obtained, as shown.

| Plate | Development Solution | Relief Obtained, mils (μm) |
|---|---|---|
| A | 0.8% sodium carbonate in 2-(2-butoxyethoxy)ethanol/water (15/85) | 23 (585) |
| B | 0.8% 2-amino-2-methyl-1-propanol in 2-(2-butoxyethoxy)-ethanol/water (15/85) | 40 (1015) |
| C | 0.8% 2-dimethylamino-2-methyl-1-propanol in 2-(2-butoxyethoxy)-ethanol/water (15/85) | 30 (760) |

-continued

| Plate | Development Solution | Relief Obtained, mils (μm) |
|---|---|---|
| D | 0.8% 2-amino-2-ethyl-1,3-propanediol in 2-(2-butoxyethoxy)ethanol/water (15/85) | 54 (1370) |

Solvent resistance data are summarized in the Table for a 2840-μm plate which was developed in a solution of 0.8% diethanolamine in 2-(2-butoxyethoxy)ethanol/water (15/85).

A 2840-μm plate with excellent thickness uniformity was prepared by melt-pressing the photosensitive composition in a steel mold, containing a 12.7×17.8 cm cavity, at 120°/20,000 psi (138,000 kPa) onto a polyester film substrate. The polytetrafluoroethylene cover sheet was replaced, after pressing, with a polypropylene cover sheet. This plate was exposed as follows: 50 sec back-exposure; 9 min top-exposure through a line process negative; 10 min postexposure after development for 30 min at 55° to 60° in a solution of 0.8% diethanolamine in 2-(2-butoxyethoxy)ethanol/water (15/85); drying and posttreatment for 2 min with an aqueous sodium hypochlorite solution as described in Example 1. The posttreatment was employed to eliminate a faint tackiness exhibited by the plate. The finished plate had excellent flexibility, imaging characteristics and physical properties: relief, 45 mils (1140-μm); Shore A hardness, 50; resilience, excellent; impact resilience, 45.

EXAMPLE 6

The following ingredients were premixed and blended on a rubber mill at 100° for 10 min by the general procedure described.
75 parts of the binder of Example 5, Part A
12 parts of n-octyl methacrylate
12 parts of 1,6-hexanediol diacrylate
1 part of benzil dimethyl ketal
0.5 part of 4-methyl-2,6-di-t-butylphenol
67 parts of methylene chloride.
The clear, tacky composition was removed from the mill after the rolls were cooled to room temperature.

Plates were pressed from the composition, and the plates were exposed and then developed for 30-min in a solution of 0.8% 2-amino-2-ethyl-1,3-propanediol in 2-(2-butoxyethoxy)ethanol/water (15/85) by the general procedure described. The postexposed plates exhibited the following properties. Solvent resistance data are summarized in the Table. The imaging characteristics were similar to those of the plates described in Example 1. Shore A hardness, 64; relief, 56 mils (1420 μm); resilience, excellent; impact resilience, 37.

EXAMPLE 7

This Example illustrates preparation of a photosensitive composition by a continuous process on the mill without isolation of the binder.

A plug consisting of 70 parts of Kraton ® 1107, 7 parts of 3-mercaptopropionic acid, and 40 parts of methylene chloride was blended on a rubber mill at 50° for 20 min. The following liquids were added successively to the mill with continued blending at 50°: (a) a mixture of oleic acid (4.5 parts) and 1,6-hexanediol diacrylate (8.0 parts), and (b) a mixture of 1,6-hexanediol diacrylate (8.0 parts), 4-methyl-2,6-di-t-butylphenol (1.0 part) and benzil dimethyl ketal (1.5 parts). The composition was milled for 15 min after addition of solution (a) and for an additional 10 min after addition of solution (b). A clear, tacky sheet of the photosensitive composition resulted.

Plates were pressed from the composition, and the plates were exposed and then developed for 30 min in a solution of 0.8% diethanolamine in 2-(2-butoxyethoxy)ethanol/water (1/9) by the general procedure described. The postexposed plates exhibited the following properties. The imaging characteristics were similar to those of the plate described in Example 1. Solvent resistance data are summarized in the Table. Shore A hardness, 31–34; relief, 12 mils (305 μm); resilience, poor; impact resilience, 26.

EXAMPLE 8

A. Preparation of Binder

A plug consisting of 200 g of a 16/84 styrene/isoprene radial ABA block copolymer (Solprene ® 423; Phillips Chemical Co., $M_n=290,000$); 50 g of 3-mercaptopropionic acid, and 100 ml of methylene chloride was blended on a rubber mill at 75° for 30 min. The crude product was dissolved in a solution of 1-liter of methylene chloride, 50 ml of methanol, and 4.0 g of 1,3,5-trimethyl-2,4,6-tris(3,5-di-t-butyl-4-hydroxybenzyl)benzene antioxidant. The polymer was precipitated from solution in a four-fold excess of methanol in a high-speed blender, washed, and dried as described in Example 2. The dried, tacky polymer was characterized by infrared spectrum (film) and by sulfur analysis; medium $C=O$ absorption at 1700–1750 $cm^{-1}$; 1.16% S corresponds to 1.63% carboxyl groups.

B. Photosensitive Composition: Preparation and Imaging

The following ingredients were premixed and blended on a rubber mill at 100° for 5 min by the general procedure described.
75 parts of the binder of Part A
12 parts of oleic acid
12 parts of 1,6-hexanediol diacrylate
0.5 part of 4-methyl-2,6-di-t-butylphenol
0.1 part of 1,4,4-trimethyl-2,3-diazabicyclo [3.2.2]non-2-ene-N,N'-dioxide
1.0 part of benzil dimethyl ketal
33 parts of methylene chloride.
The clear, tacky composition was removed after the rolls were cooled to room temperature.

Plates were pressed from the composition, and the plates were exposed and then developed for 30 min in a solution of 0.8% sodium carbonate in 2-(2-butoxyethoxy)ethanol/water (1/9), by the general procedure described. The postexposed plates exhibited the following properties. The imaging characteristics were similar to those of the plates described in Example 1. Solvent resistance data are summarized in the Table. Shore A hardness, 54; relief, 15 mils (380 μm); resilience, good; impact resilience, 24.

When the plate was developed for 30 min in a solution of 1.7% concentrated ammonia in 2-(2-butoxyethoxy)ethanol/water (1/9), a relief of about 30 mils (760 μm) was obtained.

EXAMPLE 9 AND COMPARISON C

A. Preparation of Binder

A plug consisting of 100 g of a 28/72 styrene/butadiene linear ABA block copolymer (Kraton ® 1102; Shell Chemical Co., $M_n$ about 100,000), 15 g of 3-mercaptopropionic acid, and 50 ml of methylene chloride was blended on a rubber mill at 60° for 30 min. The crude product was dissolved in a solution of 500 ml of methylene chloride, 25 ml of methanol and 2.0 g of 1,3,5-trimethyl-2,4,6-tris(3,5-di-t-butyl-4-hydroxylbenzyl)benzene antioxidant. The polymer was precipitated from solution in a four-fold excess of methanol in a high speed blender, washed, and dried as described in Example 2. The dried, nontacky polymer was characterized by infrared spectrum (film) and by sulfur analysis; strong C=O absorption at 1700–1750 cm$^{-1}$; 2.32% S corresponds to 3.26% carboxyl groups.

B. Photosensitive Composition: Preparation and Imaging

The following ingredients were premixed and blended on a rubber mill at 100° for 5 min by the general procedure described:

Formulation A 75 parts of the binder of Part A
12 parts of oleic acid
12 parts of 1,6-hexanediol diacrylate
0.5 part of 4-methyl-2,6-di-t-butylphenol
1.0 part of benzil dimethyl ketal
33 parts of methylene chloride.

Comparison C 75 parts of unmodified Kraton ® 1102
12 parts of oleic acid
12 parts of 1,6-hexanediol diacrylate
0.5 part of 4-methyl-2,6-di-t-butylphenol
1.0 part of benzil dimethyl ketal
0.1 part of 1,4,4-trimethyl-2,3-diazabicyclo[3.2.2]non-2-ene-N,N'-dioxide
67 parts of methylene chloride.

The clear, tacky photosensitive compositions were removed from the mill after the rolls were cooled to room temperature.

Plates were prepared from the compositions, and the plates were exposed and then developed for 30 min at 55° to 60°. Results with the 1650-μm plates were as follows:

| Development Solution | Formulation | Relief, μm |
| --- | --- | --- |
| 0.8% sodium carbonate in 2-(2-butoxyethoxy)ethanol/water (1/9) | A | Development Incomplete |
| | Comparison C | Negligible |
| 0.8% sodium hydroxide in 2-(2-butoxyethoxy)ethanol/water (1/9) | A | Development Incomplete |
| 0.8% diethanolamine in 2-(2-butoxyethoxy)ethanol/water (1/9) | A | 150 |
| 1.7% conc. ammonia in 2-(2-butoxyethoxy)ethanol/water (1/9) | A | 510 |
| | Comparison C | Negligible |

Hence, the Comparison Plate gave essentially no relief image because of lack of significant development. The 2840-μm plates were developed as follows:

Formulation A 1.7% conc. ammonia in 2-(2-butoxyethoxy) ethanol/water (1/9)

Comparison C 0.8% sodium carbonate in 2-(2-butoxyethoxy) ethanol/water (1/9).

Physical property data for the plates after postexposure are summarized hereafter, and solvent resistance data are summarized in the Table. Shore A Hardness: 80 (Formulation A), 75 to 78 (Comparison C); Resilience: Good (Formulation A), Good (Comparison C); Impact Resilience: 38 (Formulation A), 51 (Comparison C).

EXAMPLE 10

This Example illustrates preparation of a photosensitive composition by a continuous process on the mill without isolation of the binder.

A plug consisting of 70 parts of Kraton ® 1102, 10 parts of 3-mercaptopropionic acid, and 80 parts of methylene chloride was blended on a rubber mill at 75° for 30 min. The following liquids were added successively to the mill with continued blending at 75°: (a) 6.5 parts of 1,6-hexanediol diacrylate, and (b) a mixture of 1,6-hexanediol diacrylate (10.0 parts), 4-methyl-2,6-di-t-butylphenol (2.0 parts) and benzil dimethyl ketal (1.5 parts). The blend was milled for 10 min after addition of solution (a) and for an additional 10 min after addition of solution (b). A clear, tacky sheet of the photosensitive composition resulted.

Plates were pressed from the composition, and the plates were exposed and then developed for 20 min in a solution of 0.8% diethanolamine in 2-(2-butoxyethoxy)ethanol/water (1/9) by the general procedure described. Imaging characteristics were similar to those of the plate described in Example 1. The postexposed plates exhibited the following properties. Solvent resistance data are summarized in the Table. Shore A hardness, 84–87; relief, 30 mils (760 μm); impact resilience, 29–31.

EXAMPLE 11

A plug consisting of 70 parts of Kraton ® 1102, 7 parts of 3-mercaptopropionic acid, and 80 parts of methylene chloride was blended on a rubber mill at 75° for 30 min. The following liquids were added successively to the mill with continued blending at 75°: (a) 10 parts of n-octyl methacrylate, and (b) a mixture of 1,6-hexanediol diacrylate (10 parts), 4-methyl-2,6-di-t-butylphenol (1 part) and benzil dimethyl ketal (2 parts). The blend was milled for 15 min after addition of solution a and for an additional 10 min after addition of solution b. A clear, tacky sheet of the photosensitive composition resulted.

Plates were pressed from the composition, and the plates were exposed and then developed for 20 min in a solution of 0.8% ammonium carbonate in 2-(2-butoxyethoxy)ethanol/water (1/9) by the general procedure described. The postexposed plates exhibited the following properties. Solvent resistance data are summarized in the Table. Shore A hardness, 83–86; relief, 23 mils (585 μm); resilience, fair; impact resilience, 30–31.

EXAMPLES 12 TO 14

The procedure of Example 11 was repeated except that Kraton ® 1102 was replaced in each Example with 70 parts of the styrene/butadiene copolymer designated below. The photosensitive compositions were melt-pressed into plates and the 1650-μm plates were exposed and then developed for 30 min at 55° to 60° in a solution of 1.7% conc. ammonia in 2-(2-butoxyethoxy)ethanol/water (1/9) by the general procedure described. Similar relief images were obtained when 0.8% ammonium carbonate in 2-(2-butoxyethoxy)ethanol/- water (1/9) was used for development. Results are summarized below:

| Styrene/Butadiene Copolymer | Relief, μm |
|---|---|
| Example 12 | 180 |
| Example 13 | 280 |
| Example 14 | 150 |

The styrene/butadiene copolymers employed in these Examples were obtained from Phillips Chemical Co. Example 12: Solprene® 422, a 20/80 styrene/butadiene radial ABA block copolymer, $M_n$=160,000. Example 13: Solprene® 1205C, a 25/75 styrene/butadiene linear AB block copolymer, $M_n$=83,000. Example 14: Philprene® 1506, a styrene/butadiene random copolymer, $M_n$=about 200,000.

The 2840-μm plates were exposed and then developed for 30 min at 55° to 60° in a solution of 0.8% ammonium carbonate in 2-(2-butoxyethoxy)ethanol/water (1/9) by the general procedure described. For Example 12, Shore A hardness was 67–71 and impact resilience was 53–54. For Example 13, the Shore A hardness was 74–76 and the impact resilience was 40–43. For Example 14, the Shore A hardness was 56–67 and the impact resilience was 44–46. Solvent resistance data are summarized in the Table.

Although the mercaptocarboxylic acid-modified polymeric binders were not isolated in Examples 12 to 14 prior to preparation of the photosensitive compositions, similar binders have been isolated and characterized in separate experiments. For example, a plug containing 200 g of the copolymer employed in Example 12, 50 g of thioglycollic acid and 100 ml of methylene chloride was blended on the mill for 30 min at 75°. The clear sheet was dissolved in a solution of 1000 ml of methylene chloride, 50 ml of methanol, and 4.0 g of 1,3,5-trimethyl-2,4,6-tris(3,5-di-t-butyl-4-hydroxybenzyl)benzene antioxidant. The polymer was precipitated from solution in a four-fold excess of methanol in a high speed blender, washed, and dried as described in Example 2. The dried, nontacky poymeric binder was characterized by its infrared spectrum (film) and by sulfur analysis; medium C=O absorption at 1700–1750 cm$^{-1}$; 2.31% S corresponds to 3.25% carboxyl groups.

EXAMPLE 15

A plug consisting of 65 parts of Kraton® 1102, 15 parts of 11-mercaptoundecanoic acid, and 80 parts of methylene chloride was blended on a rubber mill at 75° for 30 min. The following liquids were then added successively to the mill with continued blending at 75°: (a) a mixture of 1,6-hexanediol diacrylate (5 parts) and oleic acid (4.0 parts), and (b) a mixture of 1,6-hexanediol diacrylate (5.0 parts) oleic acid (3.0 parts), 4-methyl-2,6-di-t-butylphenol (1.5 parts), and benzil dimethyl ketal (1.5 parts). The blend was milled for 15 min after addition of solution a and for an additional 10 min after addition of solution b. A clear, nontacky sheet of the photosensitive composition resulted.

Plates were pressed from the composition, and the plates were exposed and then developed for 30 min in a solution of 0.8% 2-amino-2-ethyl-1,3-propanediol in 2-(2-butoxyethoxy)ethanol/water (15/85) by the general procedure described. The postexposed plates exhibited the following properties. Solvent resistance data are summarized in the Table. Shore A hardness, 66–69; relief, 16 mils (405 μm); resilience, excellent; impact resilience, 41–42. The imaging characteristics were similar to those of the plate described in Example 1.

EXAMPLE 16

A mixture of 68 parts of poly(cis-butadiene) (Ameripol® CB 220; B. F. Goodrich Co.; 98% cis, Mooney viscosity of about 40), 7 parts of 3-mercaptopropionic acid and 80 parts of methylene chloride was blended on a rubber mill at 75° for 30 min. The following solutions were then added successively to the mill with continued blending at 75°: (a) a solution of 7 parts of 1,6-hexanediol diacrylate and 5 parts of oleic acid, and (b) a solution of 3 parts of 1,6-hexanediol diacrylate, 6.5 parts of oleic acid, 2.0 parts of 4-methyl-2,6-di-t-butylphenol, and 1.5 parts of benzil dimethyl ketal. The blend was milled for 15 min after addition of solution (a) and for 10 min after addition of solution (b). A clear, tacky sheet of the photosensitive composition was obtained.

Plates were pressed from the blend and the plates were exposed and then developed for 30 min in a solution of 0.8% 2-amino-2-ethyl-1,3-propanediol in 2-(2-butoxyethoxy)ethanol/water (15/85) by the general procedure described. The plates were postexposed and evaluated. Solvent resistance data are summarized in the Table. Shore A hardness, 37; relief, 10 mils (254 μm); impact resilience, 59. The imaged plate exhibited fair image sharpness some of which was lost when the plate was heated.

EXAMPLE 17

A plug consisting of 70 parts of poly(isoprene) (smoke sheet obtained from Baird Rubber and Trading Co., Rubber Product No. SMR-5-CV), 10 parts of 3-mercaptopropionic acid, and 80 parts of methylene chloride was blended on a rubber mill at 50° for 20 min. Cold water was then passed through the mill to cool the rolls and the mixture was milled for an additional 20 min. The mill was then rewarmed to 50° and the following liquids were added successively with continued blending: (a) 6.5 parts of 1,6-hexanediol diacrylate, and (b) a solution of 10 parts of 1,6-hexanediol diacrylate, 2.0 parts of 4-methyl-2,6-di-t-butylphenol and 1.5 parts of benzil dimethyl ketal. The blend was milled for 15 min after addition of (a) and for 10 min after addition of (b). A pale yellow, hazy sheet of the photosensitive composition was obtained.

Plates were pressed from the blend and the plates were exposed and developed for 30 min in a solution of 0.8% 2-amino-2-ethyl-1,3-propanediol in 2-(2-butoxyethoxy)ethanol/water (15/85) by the general procedure described. The plates were postexposed and evaluated. Solvent resistance data are summarized in the Table. Shore A hardness, 30; relief, about 10 mils (254 μm); impact resilience, 49. The relatively low Shore A hardness contributed to somewhat low plate strength and image sharpness.

EXAMPLE 18

A total of 68 parts of butadiene/acrylonitrile copolymer (Hycar® 1092-30; B. F. Goodrich; containing about 33% acrylonitrile; average Mooney viscosity of 30) was milled on a rubber mill at room temperature, and the following ingredients were then added successively with continuous milling to the resultant blend: (a) 10 parts of 3-mercaptopropionic acid; (b) 9 parts of n-octyl methacrylate; and (c) a solution of 9 parts of 1,6-hexanediol diacrylate, 2 parts of 4-methyl-2,6-di-t-butylphenol, and 2 parts of benzil dimethyl ketal. The blend was milled for 20 min after addition of (a), 15 min after addition of (b) and 10 min after addition of (c). A clear sheet of the photosensitive composition was obtained.

Plates were pressed from the blend and the plates were exposed and developed for 30 min in a solution of 2-amino-2-ethyl-1,3-propanediol in 2-(2-butoxyethoxy)ethanol/water (15/85) by the general procedure described. The plates were postexposed and evaluated. Solvent resistance data are summarized in the Table. The relatively high percent volume swell in mixed solvent is attributed to the high polarity of the modified polymer. Shore A hardness, 25 to 27; relief, about 8 mil (203 μm); impact resilience, 26 to 29. The relatively low Shore A hardness contributed to somewhat low plate strength and image sharpness.

EXAMPLE 19

This Example illustrates the use of a mixture of mercaptocarboxylic acid-modified polymers as the binder component.

A plug consisting of 50 parts of 3-mercaptopropionic acid-modified Kraton ® 1107 (1.13% carboxyl groups), 25 parts of 3-mercaptopropionic acid-modified Kraton ® 1102 (2.84% carboxyl groups), 12 parts of oleic acid, 12 parts of 1,6-hexanediol diacrylate, 0.5 part of 4-methyl-2,6-di-t-butylphenol, 1 part of benzil dimethyl ketal, and 67 parts of methylene chloride was blended on a rubber mill at 100° for 10 min. A transparent, tacky sheet of the photosensitive composition was obtained.

Plates were pressed from the blend, and the plates were exposed and developed for 30 min in a solution of 0.8% 2-amino-2-ethyl-1,3-propanediol in 2-(2-butoxyethoxy)ethanol/water (15/85) by the general procedure described. The plates were postexposed and evaluated. Solvent resistance data are summarized in the Table. Shore A hardness, 64 to 67; relief, 22 mils (560 μm); impact resilience, 35 to 38. The transparent, very faintly hazy plate was characterized by good flexibility and excellent image sharpness in the raised relief areas.

EXAMPLE 20

A. Preparation of Binder

A mixture of 200 g of Kraton ® 1107, 30 g of 3-mercaptopropionic acid, and 100 ml of methylene chloride was prepared, and the plug was transferred to a rubber mill and milled at 60° for 25 min. The milled product was dissolved in 500 ml of methylene chloride which contained 4 g of 1,3,5-trimethyl-2,4,6-tris(3,5-di-t-butyl-4-hydroxybenzyl)benzene antioxidant. This solution was combined with four other solutions prepared by identical runs. The polymer was precipitated from the combined solution in an excess of methanol in a high-speed blender, washed, and dried as described in Example 2.

Anal. Found: S, 0.88, 0.76 $CO_2H$, 1.24, 1.07.

B. Photosensitive Composition: Preparation and Imaging

The following ingredients were premixed and blended on a rubber mill at 100° for 10 minutes by the general procedure described:
75 g of the polymer of Part A
12 g of oleic acid
12 g of 1,6-hexanediol diacrylate
0.5 g of 4-methyl-2,6-di-t-butylphenol
1.0 g of benzoin isobutyl ether
30 ml of methylene chloride. The clear, tacky composition was removed from the mill after the rolls were cooled to room temperature.

Plates were pressed from the composition. The plates were exposed and then developed for 30 min in a solution of 1.0% 2-amino-2-ethyl-1,3-propanediol in 2-(2-butoxyethoxy)ethanol/water (15/85) by the general procedure described. The plates were postexposed and evaluated. Solvent resistance data are summarized in the Table. Shore A hardness, 47; relief, 24 mils (610 μm); impact resilience, 27.

EXAMPLE 21

Another batch of the binder described in Example 20 was prepared.

Anal. Found: S, 0.67, 0.84 $CO_2H$, 1.06.

The following ingredients were premixed and blended on a rubber mill at 100° for 10 minutes by the general procedure described:
75 g of binder
12 g of oleic acid
12 g of trimethylolpropane triacrylate
0.5 g of 4-methyl-2,6-di-t-butylphenol
1.0 g of benzil dimethyl ketal
30 ml of methylene chloride.

The clear, tacky composition was removed from the mill after the rolls were cooled to room temperature.

Plates were prepared, exposed, and developed as described for the composition of Example 20. Solvent resistance data are summarized in the Table. Shore A hardness, 57; relief, 8 mils (220 μm); impact resilience, 37.

EXAMPLE 22

The binder of Example 21 was employed. The following ingredients were premixed and blended on a rubber mill at 100° for 10 minutes by the general procedure described:
75 g of binder
16 g of Hycar ® CTB (2000×162)
8 g of trimethylolpropane triacrylate
0.5 g of 4-methyl-2,6-di-t-butylphenol
1.0 g of benzil dimethyl ketal
30 ml of methylene chloride.
The composition was removed from the mill after the rolls were cooled to room temperature.

Plates were prepared, exposed, and developed as described for the composition of Example 20. Solvent resistance data are summarized in the Table. Shore A hardness, 54; relief, 20 mils (510 μm); impact resilience, 35.

TABLE

Summary of Immersion Data Showing Satisfactory Percent Swell and Percent Weight Depletion for the Aqueous-Processible Compositions of This Invention

| Example No. or Comparison Letter | Solvent | 24 Hr.-Immersion % Vol Swell | % Wt. Depletion |
|---|---|---|---|
| 1 | Ethanol | 2.1 | 6.3 |
| 2 | Ethanol | 2.2 | 3.0 |
| 3 | Ethanol | 0.7 | 3.6 |
| 3 | Mixed Solvent[1] | 0.1 | 2.1 |
| A | Ethanol | −1.0 | 3.3 |
| A | Mixed Solvent[1] | −1.2 | 2.4 |
| 4 | Ethanol | 2.4 | 0.5 |
| 4 | Mixed Solvent[1] | 2.0 | 0.2 |
| B | Ethanol | 2.0 | 0.4 |

TABLE-continued
Summary of Immersion Data Showing Satisfactory Percent Swell and Percent Weight Depletion for the Aqueous-Processible Compositions of This Invention

| Example No. or Comparison Letter | Solvent | 24 Hr.-Immersion % Vol Swell | 24 Hr.-Immersion % Wt. Depletion |
|---|---|---|---|
| B | Mixed Solvent[1] | 0.3 | 0.3 |
| 5 | Ethanol | 1.0 | 2.2 |
| 5 | Mixed Solvent[1] | 1.4 | 1.2 |
| 5 | Mixed Solvent[2] | 2.6 | 2.6 |
| 5 | Mixed Solvent[3] | 6.4 | 3.2 |
| 6 | Ethanol | 1.8 | 0 |
| 6 | Mixed Solvent[1] | 0.4 | 0 |
| 6 | Mixed Solvent[3] | 6.4 | 0 |
| 7 | Ethanol | 3.8 | 2.3 |
| 7 | Mixed Solvent[1] | 10.7 | 1.0 |
| 8 | Ethanol | 1.3 | 3.8 |
| 8 | Mixed Solvent[1] | 1.9 | 2.4 |
| 9 | Ethanol | 2.4 | 3.8 |
| 9 | Mixed Solvent[1] | 3.8 | 1.6 |
| C | Ethanol | −1.4 | 4.6 |
| C | Mixed Solvent[1] | −1.4 | 3.2 |
| 10 | Ethanol | 5.1 | 0.9 |
| 10 | Mixed Solvent[1] | 4.1 | 0.1 |
| 11 | Ethanol | 3.7 | 0.7 |
| 11 | Mixed Solvent[1] | 2.2 | 0.2 |
| 12 | Ethanol | 1.7 | 1.1 |
| 12 | Mixed Solvent[1] | 0.5 | 0.6 |
| 13 | Ethanol | 3.4 | 0.6 |
| 13 | Mixed Solvent[1] | 1.3 | 0.2 |
| 14 | Ethanol | 2.3 | 0.8 |
| 14 | Mixed Solvent[1] | 1.0 | 0.4 |
| 15 | Ethanol | 5.6 | 3.5 |
| 15 | Mixed Solvent[1] | 14.5 | 0.9 |
| 16 | Ethanol | −3.0 | 7.4 |
| 16 | Mixed Solvent[1] | −0.7 | 5.1 |
| 17 | Ethanol | 2.5 | 1.4 |
| 18 | Ethanol | 15.5 | 2.3 |
| 18 | Mixed Solvent[1] | 62.8 | 3.0 |
| 19 | Ethanol | 1.3 | 2.6 |
| 19 | Mixed Solvent[1] | 3.7 | 1.0 |
| 19 | Mixed Solvent[3] | 8.5 | 3.4 |
| 20 | Ethanol | 0.0 | 3.5 |
| 20 | Mixed Solvent[1] | 1.3 | 2.0 |
| 20 | Mixed Solvent[3] | 5.7 | 5.0 |
| 21 | Ethanol | 0.2 | 2.6 |
| 21 | Mixed Solvent[1] | 1.3 | 1.4 |
| 21 | Mixed Solvent[3] | 5.0 | 3.5 |
| 22 | Ethanol | 2.4 | 0 |
| 22 | Mixed Solvent[1] | 1.3 | 0 |
| 22 | Mixed Solvent[3] | 7.3 | 0 |

[1]Ethanol/water/morpholine (50/45/5).
[2]Ethanol/ethyl acetate (95/5).
[3]Ethanol/ethyl acetate (85/15).

The embodiments of the invention in which an exclusive property or privilege is claimed are defined as follows:

1. A photosensitive, elastomeric composition developable in aqueous base/organic solvent mixtures comprising, by total weight of the composition,
  (i) about 40 to 90 percent of a heat workable mercaptocarboxylic acid-modified polymer selected from at least one member of the group butadiene and isoprene, said polymer characterized by having
    (a) a number average molecular weight of about 15,000 to 1,000,000,
    (b) a carboxyl content of about 1 to 15 percent by weight of polymer (i),
    (c) at least about 0.7 percent of sulfur, by weight of polymer (i),
  (ii) about 2 to 50 percent of a nongaseous, ethylenically unsaturated compound containing at least one terminal ethylenic group, said compound being compatible with polymer (i) and polymerizable by the radical generating system of (iii), and
  (iii) about 0.001 to 10 percent of a radical generating system activatable by actinic radiation.

2. A composition according to claim 1 wherein the polymer has a molecular weight of about 25,000 to 250,000 and a carboxyl content of 1 to 8 percent.

3. A composition according to claim 1 comprising, additionally, up to about 40 percent by weight of the total composition of low molecular weight butadiene polymer.

4. A composition according to claim 1 wherein the polymer is a block copolymer of butadiene/styrene.

5. A composition according to claim 1 wherein the polymer is a block copolymer of styrene/isoprene.

6. A composition according to any one of claims 1 or 2 wherein the polymer is present at about 60 to 90 percent, the ethylenically unsaturated compound is present at about 5 to 35 percent, and the radical generating system is present at about 0.1 to 5 percent.

7. A composition according to any one of claims 1 or 2 wherein the ethylenically unsaturated compound is 1,6-hexanediol diacrylate and the radical generating system is benzil dimethyl ketal.

8. A composition according to any one of claims 1 or 2 wherein the polymer is a block copolymer of butadiene/styrene or styrene/isoprene, the ethylenically unsaturated compound is 1,6-hexanediol diacrylate and the radical generating system is benzil dimethyl ketal.

9. A photosensitive element comprising a substrate coated with a layer of the composition according to claim 1.

* * * * *